(12) United States Patent
Huang et al.

(10) Patent No.: US 11,744,060 B2
(45) Date of Patent: Aug. 29, 2023

(54) MEMORY DEVICE

(71) Applicant: Taiwan Semiconductor Manufacturing Company, Ltd., Hsinchu (TW)

(72) Inventors: Huai-Ying Huang, New Taipei (TW); Yu-Ming Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 90 days.

(21) Appl. No.: 17/401,251

(22) Filed: Aug. 12, 2021

(65) Prior Publication Data

US 2023/0050415 A1    Feb. 16, 2023

(51) Int. Cl.
*H10B 10/00* (2023.01)
*H01L 29/786* (2006.01)
*H01L 27/092* (2006.01)

(52) U.S. Cl.
CPC ......... *H10B 10/12* (2023.02); *H01L 27/0922* (2013.01); *H01L 29/78675* (2013.01); *H10B 10/18* (2023.02)

(58) Field of Classification Search
CPC ............. H01L 27/1104; H01L 27/0922; H01L 27/1116; H01L 29/78675; H10B 10/12; H10B 10/18
See application file for complete search history.

(56) References Cited

U.S. PATENT DOCUMENTS

| | | | |
|---|---|---|---|
| 2007/0181953 A1* | 8/2007 | Lyu | H01L 21/8221 257/382 |
| 2020/0111798 A1* | 4/2020 | Paul | H01L 21/76895 |
| 2020/0219877 A1* | 7/2020 | Then | H01L 23/5385 |
| 2021/0343696 A1* | 11/2021 | Chae | H01L 23/5286 |
| 2022/0199629 A1* | 6/2022 | Chhabra | H01L 27/092 |

* cited by examiner

*Primary Examiner* — Karen Kusumakar
*Assistant Examiner* — Adam S Bowen
(74) *Attorney, Agent, or Firm* — JCIPRNET

(57) ABSTRACT

A memory device is provided. The memory device includes a plurality of memory cells. Each memory cell includes a latch circuit formed of N-type field effect transistors (NFETs) and P-type field effect transistors (PFETs). The NFETs are formed at a surface of a semiconductor substrate, and the PFETs are disposed at an elevated level over the NFETs.

20 Claims, 10 Drawing Sheets

US 11,744,060 B2

MEMORY DEVICE

BACKGROUND

New semiconductor applications are ever changing our lives, from new smartphones, to healthcare, factory automation and artificial intelligence. Memory working in background plays an important role in enabling these technologies, and has drawn considerable interest along with advances in computing architectures and semiconductor technologies. Static random access memory (SRAM) is widely used as on-chip cache for microprocessors, as it is inherently fast and highly compatible with complementary metal-oxide-semiconductor (CMOS) process. However, SRAM occupies an inordinate amount of real estate on a semiconductor chip. Therefore, an ability to scale down the SRAM is critical at each generation node.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
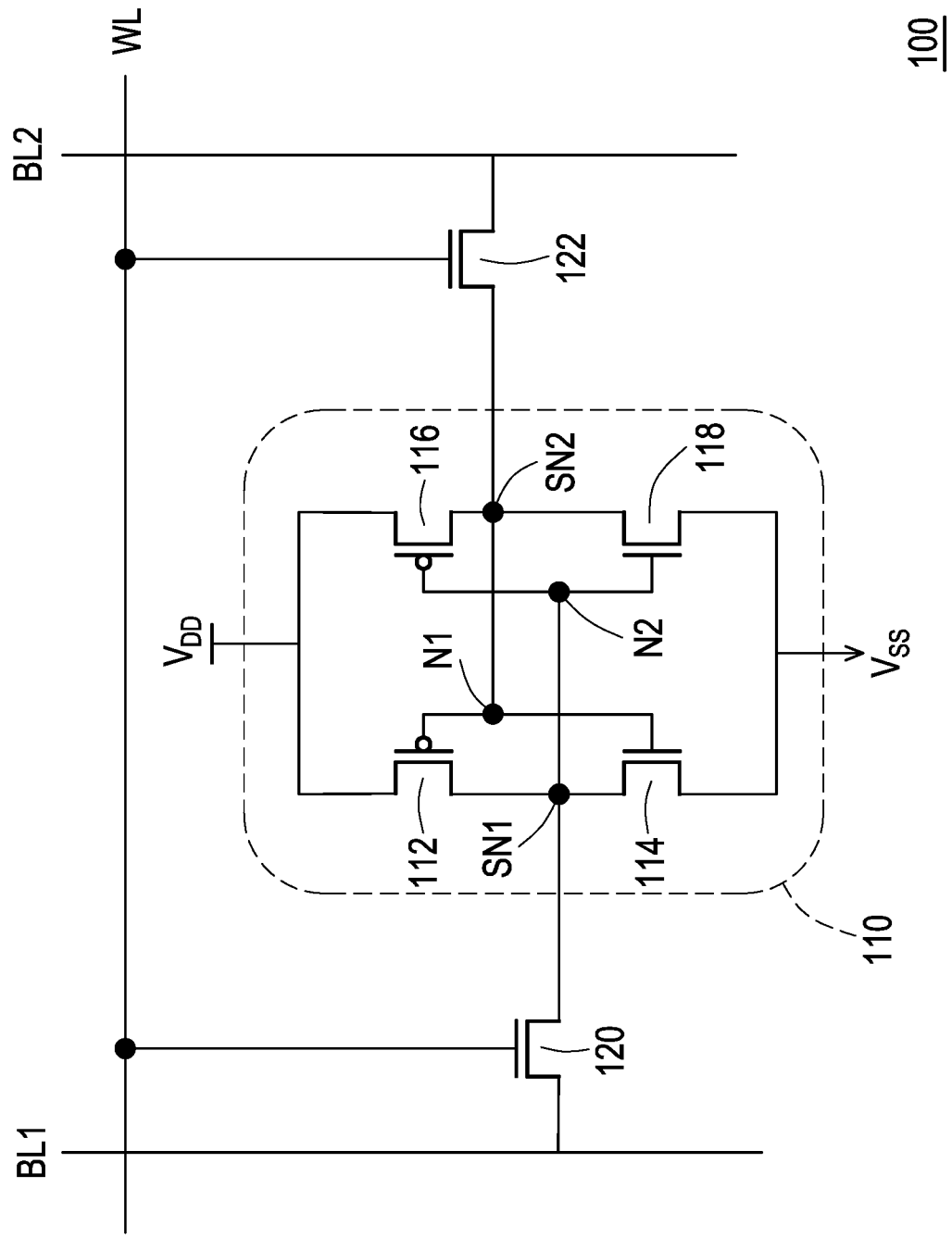
FIG. 1 is a circuit diagram of a cell in a memory device, according to some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a circuit diagram of a cell 100 in a memory device, according to some embodiments of the present disclosure.

Referring to FIG. 1, the memory device including a plurality of the cells 100 may be a static random access memory (SRAM) device. In addition, the memory device may be embedded in a logic die, and logic circuits may be formed aside an array of the cells 100.

The cell 100 includes a latch circuit 110. The latch circuit 110 is configured to retain stored data without being periodically refreshed. In some embodiments, the latch circuit 110 includes two inverters. A first one of these inverters includes a pull up transistor 112 and a pull down transistor 114. The pull up transistor 112 may be a P-type field effect transistor (PFET), while the pull down transistor 114 may be an N-type field effect transistor (NFET). The pull up transistor 112 and the pull down transistor 114 share a common source/drain terminal, and such common source/drain terminal may be referred as a storage node SN1 of the cell 100. In addition, the other source/drain terminal of the pull up transistor 112 is coupled to a working voltage $V_{DD}$. On the other hand, the other source/drain terminal of the pull down transistor 114 is coupled to a reference voltage $V_{SS}$, such as a ground voltage. Further, gate terminals of the pull up transistor 112 and the pull down transistor 114 are connected with each other. A node N1 coupled to the gate terminals of the pull up transistor 112 and the pull down transistor 114 may be an input terminal of the first inverter, and the storage node SN1 may be an output terminal of the first inverter.

Similarly, a second one of the inverters in the latch circuit 110 may include a pull up transistor 116 and a pull down transistor 118. The pull up transistor 116 may be a PFET, while the pull down transistor 118 may be an NFET. The pull up transistor 116 and the pull down transistor 118 share a common source/drain terminal, which may be referred as a storage node SN2 of the cell 100. The other source/drain terminal of the pull up transistor 116 is coupled to the working voltage $V_{DD}$, while the other source/drain terminal of the pull down transistor 118 is coupled to the reference voltage $V_{SS}$. In addition, gate terminals of the pull up transistor 116 and the pull down transistor 118 are connected with each other. A node N2 coupled to the gate terminals of the pull up transistor 116 and the pull down transistor 118 may be an input terminal of the second inverter, while the storage node SN2 may be an output terminal of the second inverter.

The node N1 as the input terminal of the first inverter is coupled to the storage node SN2 as the output terminal of the second inverter, and the node N2 as the input terminal of the second inverter is coupled to the storage node SN1 as the output terminal of the first inverter. In other words, the first and second inverters of the latch circuit 110 are cross-coupled. As a result, the storage nodes SN1, SN2 are ensured to store complementary logic data. For instance, when a logic data "0" is stored at the storage node SN1, the P-type pull up transistor 116 may be turned on as its gate terminal is coupled to the storage node SN1, and the storage node SN2 as a source/drain terminal of the pull up transistor 116 is pulled up by the working voltage $V_{DD}$ coupled to the other source/drain terminal of the pull up transistor 116. Therefore, a logic data "1" complementary to the logic data "0" is stored at the storage node SN2. On the other hand, the N-type pull down transistor 118 is kept in an off state as its gate terminal is also coupled to the storage node SN1 holding at the logic data "0", thus the storage node SN2 as a source/drain terminal of the pull down transistor 118 would not be pulled down by the reference voltage $V_{SS}$ coupled to the other source/drain terminal of the pull down transistor 118. In addition, the N-type pull down transistor 114 is turned on as its gate terminal is coupled to the storage node SN2 holding at the logic data "1", and the storage node SN1 as a source/drain terminal of the pull down transistor 114 is kept discharged by the reference voltage $V_{SS}$ coupled to the other source/drain terminal of the pull down transistor 114. In addition, the P-type pull up transistor 112 is kept in an off state as its gate terminal is also coupled to the storage node SN2 holding at the logic data "1", thus the storage node SN1 as a source/drain terminal of the pull up transistor 112 would not be pulled up by the working voltage $V_{DD}$ coupled to the other source/drain terminal of the pull up transistor 112. Therefore, the logic data "0" can be retained at the storage node SN1.

Moreover, the cell 100 may further include an access transistor 120. A gate terminal of the access transistor 120 is connected to a word line WL. In addition, a source/drain terminal of the access transistor 120 is coupled to the storage node SN1, while the other source/drain terminal of the access transistor 120 is connected to a bit line BL1. When the access transistor 120 is turned on, the bit line BL1 can charge/discharge the storage node SN1, or vice versa. Accordingly, logic data can be programmed to the storage node SN1, or read out from the storage node SN1. On the other hand, when the access transistor 120 is in an off state, the storage node SN1 is decoupled from the bit line BL1, and logic data cannot be written to or read out from the storage node SN1. In other words, the access transistor 120 may control access of the storage node SN1.

Similarly, access of the storage node SN2 is controlled by an access transistor 122. The word line WL for controlling switching of the access transistor 120 may also connect to a gate terminal of the access transistor 122. In this way, the access transistors 120, 122 may be switched simultaneously. In addition, a source/drain terminal of the access transistor 122 is coupled to the storage node SN2, while the other source/drain terminal of the access transistor 120 is connected to a bit line BL2. When the access transistor 122 is turned on, the bit line BL2 can charge/discharge the storage node SN2, or vice versa. Accordingly, logic data can be programmed to the storage node SN2, or read out from the storage node SN2. On the other hand, when the access transistor 122 is in an off state, the storage node SN2 is decoupled from the bit line BL2, and logic data cannot be written to or read out from the storage node SN2. During a write operation, the bit lines BL1, BL2 may receive complementary logic data, in order to overwrite the logic data previously stored at the storage nodes SN1, SN2. In addition, during a read operation, both of the bit lines BL1, BL2 are pre-charged, and one of them is slightly pulled down by the corresponding storage node. By comparing voltage difference of the bit lines BL1, BL2, the logic data stored at the storage nodes SN1, SN2 can be read out.

As to be further described, transistors (e.g., including the pull up transistors 112, 116, the pull down transistors 114, 118 and the access transistors 120, 122) in each cell 100 can be deployed at multiple horizontal levels. Particularly, NFETs including the pull down transistors 114, 118 and the access transistors 120, 122 may be formed at a ground level, while PFETs including the pull up transistors 112, 116 may be formed at an elevated level.

Figure 2A:
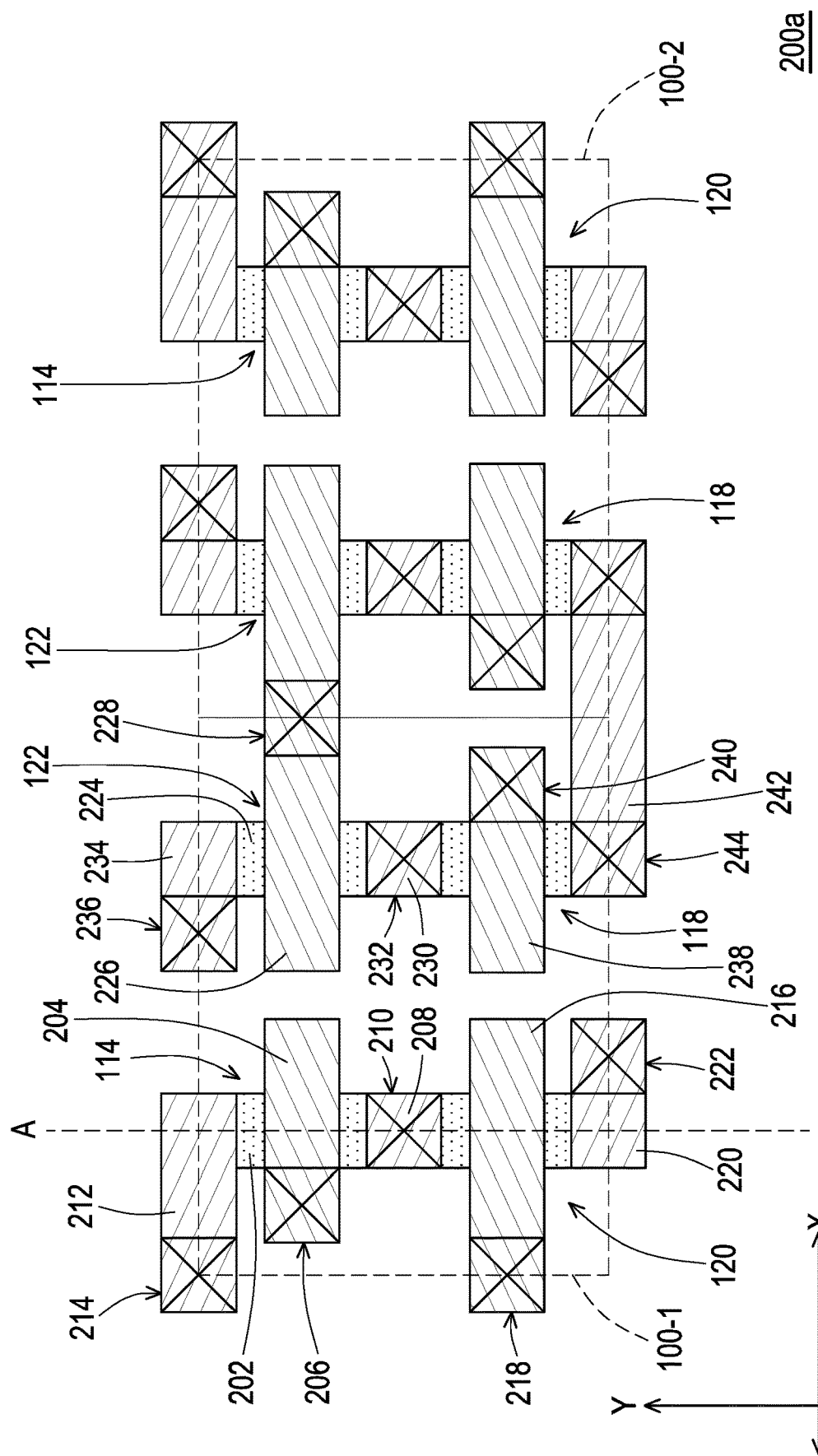
FIG. 2A is a plan view illustrating a ground level layout of two adjacent cells, according to some embodiments of the present disclosure.

FIG. 2A is a plan view illustrating a ground level layout 200a of two adjacent cells 100, according to some embodiments of the present disclosure.

Referring to FIG. 1 and FIG. 2A, two of the cells 100 (labeled as a cell 100-1 and a cell 100-2) are arranged side by side along a direction X. Although not shown, more of the cells 100 may be deployed, and may be arranged along rows and columns. Each row may extend along the direction X, while each column may extend along a direction Y intersected with the direction X.

NFETs including the pull down transistors 114, 118 and the access transistors 120, 122 in each cell 100 are formed at the ground level. Among these NFETs, the pull down transistor 114 and the access transistor 120 connected by a common source/drain terminal may be formed on an active structure 202 extending along the direction Y. In some embodiments, the pull down transistor 114 and the access transistor 120 are planar type field effect transistors (FETs), and the active structure 202 may be a doped region in a semiconductor substrate. In alternative embodiments, the pull down transistor 114 and the access transistor 120 are fin type FETs or gate-all-around (GAA) FETs, the active structure 202 may be a semiconductor fin structure or a stack of semiconductor nanosheets/rods at a surface of a semiconductor substrate. Since the pull down transistor 114 and the access transistor 120 are NFETs, the active structure 202 may be formed with P-type.

A gate line 204 is functioned as a gate terminal of the pull down transistor 114. The gate line 204 intersects and covers the active structure 202. In those embodiments where the active structure 202 extends along the direction Y, the gate line 204 may extend along the direction X. A conductive via 206 formed on the gate line 204 is disposed for out routing the gate line 204. Source/drain structures (not shown) may be formed in portions of the active structure 202 at opposite sides of the gate line 204. One of these source/drain structures is shared by the pull down transistor 114 and the access transistor 120, and may be out routed by a conductive pattern 208 formed on this source/drain structure and a conductive via 210 standing on the conductive pattern 208. Similarly, the other one of the source/drain structures may be out routed by a conductive pattern 212 formed on this source/drain structure and a conductive via 214 standing on the conductive pattern 212. In some embodiments, the conductive pattern 212 may be formed in a line shape, and intersected with the active structure 202. For instance, the conductive pattern 212 extends along the direction X while the active structure 202 extends along the direction Y.

As similar to the pull down transistor 114, a gate line 216 covering and intersected with the active structure 202 is functioned as a gate terminal of the access transistor 120. The gate line 216 may be out routed by a conductive via 218 formed on the gate line 216. The source/drain structure shared by the pull down transistor 114 and the access transistor 120 may be located between the gate lines 204, 216, and so as the conductive pattern 208 and the conductive via 210 electrically connected to this shared source/drain structure. The other source/drain structure of the access transistor 120 at the other side of the gate line 216 may also be formed in the active structure 202, and may be out routed by a conductive pattern 220 formed on this source/drain structure and a conductive via 222 standing on the conductive pattern 220. In some embodiments, the conductive pattern 220 may be formed in a line shape, and intersected with the active structure 202. For instance, the conductive pattern 220 extends along the direction X while the active structure 202 extends along the direction Y.

As other NFETs, the pull down transistor 118 and the access transistor 122 connected by a common source/drain terminal may be formed on an active structure 224. The active structure 224 may extend along the direction Y, and may be laterally spaced apart from the active structure 202 along the direction X. As similar to the active structure 202, the active structure 224 may be a doped region in a semiconductor substrate. Alternatively, the active structure 224 may be a fin structure or a stack of semiconductor nanosheets/rods at a surface of a semiconductor substrate. In addition, the active structure 224 may be formed with P-type.

A gate line 226 is functioned as a gate terminal of the access transistor 122. The gate line 226 intersects and covers the active structure 224. In those embodiments where the active structure 224 extends along the direction Y, the gate line 226 may extend along the direction X. In addition, the gate line 226 is laterally spaced apart from the gate lines 204, 216 crossing the active structure 202 and as the gate terminals of the pull down transistor 114 and the access transistor 120. In some embodiments, the gate line 226 may be substantially aligned with the gate line 204 along the direction X. A conductive via 228 formed on the gate line 226 is configured to out rout the gate line 226. Source/drain structures (not shown) may be formed in portions of the active structure 224 at opposite sides of the gate line 226. One of these source/drain structures is shared by the access transistor 122 and the pull down transistor 118, and may be out routed by a conductive pattern 230 formed on this source/drain structure and a conductive via 232 standing on the conductive pattern 230. Similarly, the other one of the source/drain structures at another side of the gate line 226 may be out routed by a conductive pattern 234 formed on this source/drain structure and a conductive via 236 standing on the conductive pattern 234. In some embodiments, the conductive pattern 234 may be formed in a line shape, and intersected with the active structure 224. For instance, the conductive pattern 234 extends along the direction X while the active structure 224 extends along the direction Y.

In regarding the pull down transistor 118 sharing the same active structure 224 with the access transistor 122, a gate line 238 covering and intersecting with the active structure 224 is functioned as a gate terminal of the pull down transistor 118. The gate line 238 is laterally spaced apart from the gate line 226 (e.g., along the direction Y), and the gate lines 238, 226 are laterally spaced apart from the gate lines 204, 216 (e.g., along the direction X). In addition, the gate line 238 may be out routed by a conductive via 240 formed on the gate line 238. The source/drain structure shared by the access transistor 122 and the pull down transistor 118 may be located between the gate lines 226, 238, and so as the conductive pattern 230 and the conductive via 232 electrically connected to this shared source/drain structure. The other source/drain structure of the pull down transistor 118 at another side of the gate line 238 may also be formed in the active structure 224, and may be out routed by a conductive pattern 242 formed on this source/drain structure and a conductive via 244 standing on the conductive pattern 242. In some embodiments, the conductive pattern 242 may be formed in a line shape, and intersected with the active structure 224. For instance, the conductive pattern 242 extends along the direction X while the active structure 224 extends along the direction Y.

Conductive elements disposed along a boundary of each cell 100 may be shared with surrounding cells 100. For instance, these conductive elements may include the conductive patterns 212, 220, 234, 242 and conductive vias 214, 218, 222, 228, 236, 244. In addition, adjacent cells 100 may be designed that the transistors with the same function share conductive element(s) at an interface of these adjacent cells 100. For instance, layout of the cell 100-1 and layout of the cell 100-2 are in mirror symmetry with respect to a shared boundary of the cells 100-1, 100-2. Accordingly, the access transistors 122 and the pull down transistors 118 of the cells 100-1, 100-2 are located between the pull down transistors 114 and the access transistors 120 of the cells 100-1, 100-2. By such design, the access transistor 122 of the cell 100-1 and the access transistor 122 of the cell 100-2 may share the conductive via 228 formed along the shared boundary of the cells 100-1, 100-2. Similarly, the pull down transistor 118 of the cell 100-1 and the pull down transistor 118 of the cell 100-2 may share the conductive pattern 242 extending across the shared boundary of the cells 100-1, 100-2.

Figure 2B:
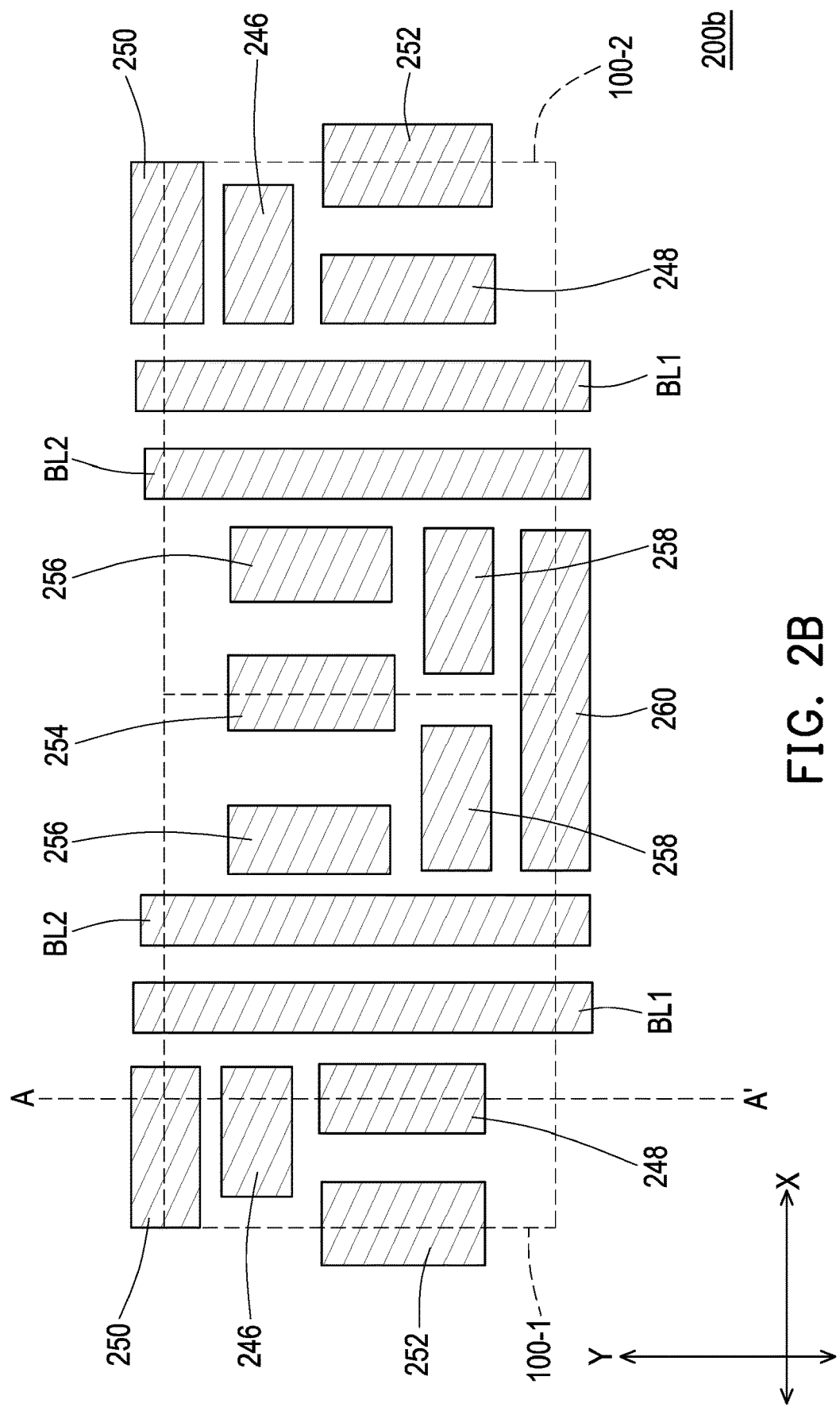
FIG. 2B is a plan view illustrating a second level layout of the adjacent cells, according to some embodiments of the present disclosure.

FIG. 2B is a plan view illustrating a second level layout 200b of the adjacent cells 100-1, 100-2, according to some embodiments of the present disclosure.

Referring to FIG. 2A and FIG. 2B, the transistors in the ground level layout 200a as described with reference to FIG. 2A are routed upwardly to the conductive elements in the second level layout 200b as shown in FIG. 2B.

The conductive via 206 coupled to the gate line 204 of the pull down transistor 114 may extend to an interconnection pattern 246 in the second level layout 200b. The term "interconnection pattern" in the present disclosure indicates connection between two transistors, such as connection between an NFET and a PFET. As an example, the gate line 204 of the pull down transistor 114 formed in the ground level layout 200a may be routed to a gate line of the pull up transistor 112 formed in the third level layout 200c (to be described with reference to FIG. 2C) through the interconnection pattern 246. In some embodiments, the gate line 204 in the ground level layout 200a and the interconnection pattern 246 in the second level layout 200b overlap, and extend along the same direction (e.g., the direction X). In addition, the conductive via 210 coupled to the shared source/drain structure of the pull down transistor 114 and the access transistor 120 may extend to an interconnection pattern 248 in the second level layout 200b, which may be further connected to a gate line of the pull up transistor 116 in the third level layout 200c (to be described with reference to FIG. 2C). In some embodiments, the active structure 202 in the ground level layout 200a and the interconnection pattern 248 in the second level layout 200b overlap, and extend along the same direction (e.g., the direction Y). Further, the conductive via 214 coupled to the other source/drain structure of the pull down transistor 114 may extend to a reference voltage line 250 in the second level layout 200b. The term "reference voltage line" in the present disclosure indicates a signal line coupled to the reference voltage $V_{SS}$ as described with reference to FIG. 1A. In some embodiments, the conductive pattern 212 lying below the conductive via 214 in the ground level layout 200a and the reference voltage line 250 in the second level layout 200b overlap, and extend along the same direction (e.g., the direction X).

The conductive via 218 coupled to the gate line 216 of the access transistor 120 may extend to a word line 252 in the second level layout 200b. The word line WL described with reference to FIG. 1A may include multiple line segments spreading at different horizontal levels, and the word line 252 may be one of these line segments in the second level layout 200b. In some embodiments, the conductive via 218 in the ground level layout 200a and the word line 252 in the second level layout 200b overlap, and extend along the same direction (e.g., the direction Y). As described above, the conductive via 210 coupled to the source/drain structure shared by the pull down transistor 114 and the access transistor 120 may extend to the interconnection pattern 248 in the second level layout 200b. In addition, the conductive via 222 coupled to the other source/drain structure of the access transistor 120 may extend to the bit line BL1 in the second level layout 200b. In some embodiments, the conductive pattern 220 lying below the conductive via 222 in the ground level layout 200a is intersected with the bit line BL1 in the second level layout 200b. For instance, the conductive pattern 220 in the ground level layout 200a may extend along the direction X, while the bit line BL1 in the second level layout 200b may extend through the cell 100-1 along the direction Y.

In regarding the access transistor 122 and the pull down transistor 118 placed aside the pull down transistor 114 and the access transistor 120 in the ground level layout 200a, the conductive via 228 coupled to the gate line 226 of the access transistor 122 may extend to a word line 254 in the second level layout 200b. The word line 254 may be another line segment of the word line WL in the second level layout 200b. In some embodiments, the conductive via 228 in the ground level layout 200a and the word line 254 in the second level layout 200b overlap, and extend along the same direction (e.g., the direction Y). The conductive via 232 coupled to the source/drain structure shared by the access transistor 122 and the pull down transistor 118 may extend to an interconnection pattern 256 in the second level layout 200b, which may be further connected to a gate line of the pull up transistor 112 in the third level layout 200c (to be described with reference to FIG. 2C). In some embodiments, the active structure 224 in the ground level layout 200a and the interconnection pattern 256 in the second level layout 200b overlap, and extend along the same direction (e.g., the direction Y). Further, the conductive via 236 coupled to the other source/drain structure of the access transistor 122 may extend to the bit line BL2 in the second level layout 200b. In some embodiments, the conductive pattern 234 lying below the conductive via 236 in the ground level layout 200a is intersected with the bit line BL2 in the second level layout 200b. For instance, the conductive pattern 234 in the ground level layout 200a may extend along the direction X, while the bit line BL2 in the second level layout 200b may extend through the cell 100-1 along the direction Y. In addition, the bit lines BL1, BL2 in the second level layout 200b are laterally spaced apart from each other.

The conductive via 240 coupled to the gate line 238 of the pull down transistor 118 may extend to an interconnection pattern 258 in the second level layout 200b, which may be further connected to a gate line of the pull up transistor 116 in the third level layout 200c (to be described with reference to FIG. 2C). In some embodiments, the gate line 238 in the ground level layout 200a and the interconnection pattern 258 in the second level layout 200b overlap, and extend along the same direction (e.g., the direction X). As described above, the conductive via 232 coupled to the source/drain structure shared by the access transistor 122 and the pull down transistor 118 may extend to the interconnection pattern 256 in the second level layout 200b. In addition, the conductive via 244 coupled to the other source/drain structure of the pull down transistor 118 may extend to a reference voltage line 260 in the second level layout 200b. In some embodiments, the conductive pattern 242 lying below the conductive via 244 in the ground level layout 200a and the reference voltage line 260 in the second level layout 200b overlap, and extend along the same direction (e.g., the direction X).

As similar to the ground level layout 200a, conductive elements of the second level layout 200b disposed along a boundary of each cell 100 may be shared with surrounding cells 100. For instance, these conductive elements may include the reference voltage lines 250, 260 and the word lines 252, 254. In those embodiments where the layouts of the adjacent cells 100 at the ground level are in mirror symmetry with respect to a shared boundary, layout of adjacent cells 100 in the second level may be symmetry with respect to a shared boundary as well. In these embodiments, the word line 254 disposed along the common boundary of the cells 100-1, 100-2 as well as the reference voltage line 260 extending across the common boundary of the cells 100-1, 100-2 may be shared by the cells 100-1, 100-2. Furthermore, conductive elements of the second level layout 200b extending through each cell 100 may be shared with other cells 100 in the same column. For instance, the bit lines BL1, BL2 in each cell 100 may be shared with other cells 100 in the same column.

Figure 2C:
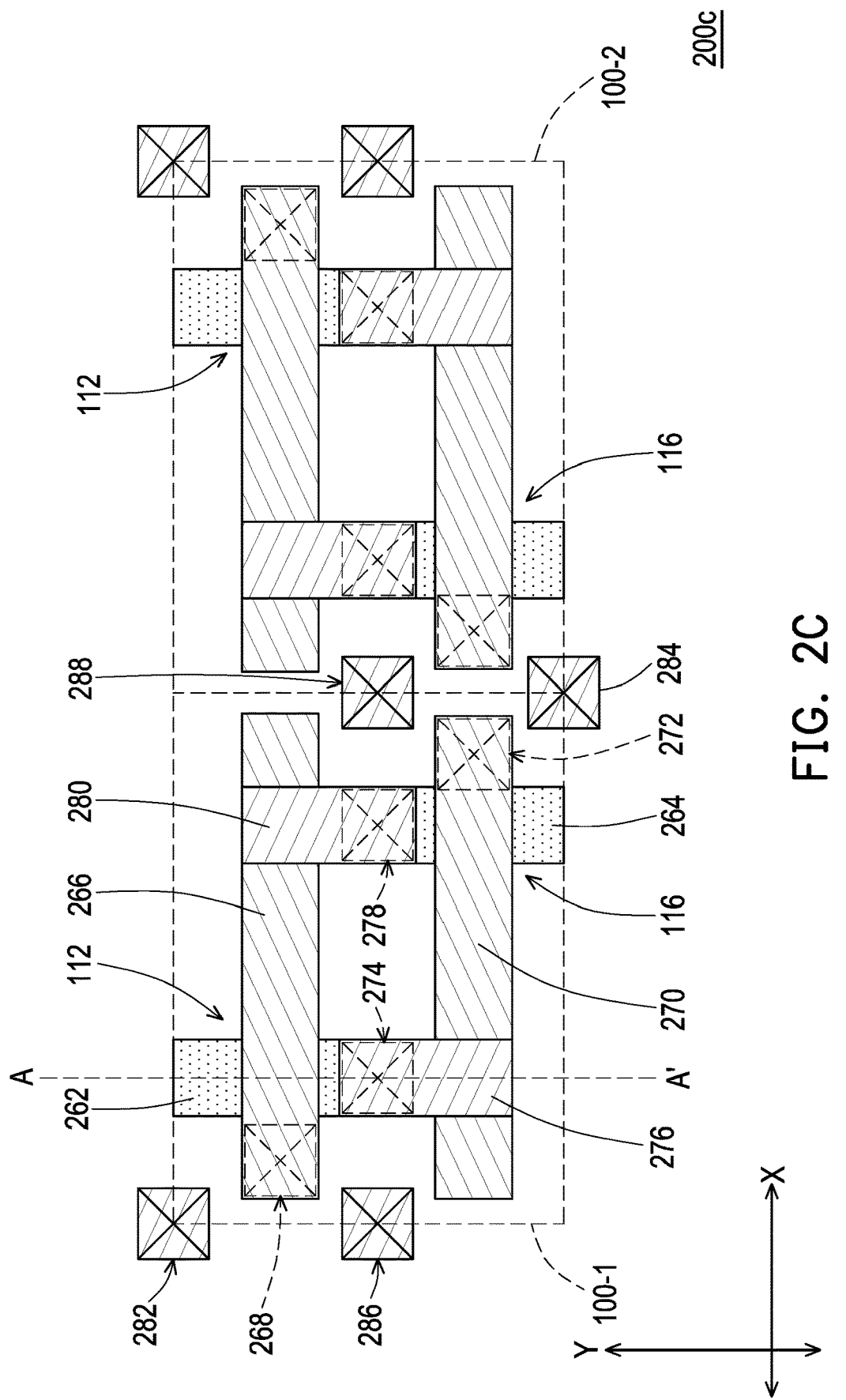
FIG. 2C is a plan view illustrating a third level layout of the adjacent cells, according to some embodiments of the present disclosure.

FIG. 2C is a plan view illustrating a third level layout 200c of the adjacent cells 100-1, 100-2, according to some embodiments of the present disclosure.

Referring to FIG. 2C, PFETs including the pull up transistors 112, 116 in each cell 100 may be formed at the third level over the ground level and the second level. The pull up transistor 112 may be formed on an active structure 262, while the pull up transistor 116 may be formed on an active structure 264. As will be further described, the active structures 262, 264 may be portions of a semiconductor layer. Since the pull up transistors 112, 116 are PFETs, the active structures 262, 264 may be formed with N-type. In addition, the active structures 262, 264 may extend along the same direction (e.g., the direction X), and are laterally spaced apart from each other (e.g., along the direction Y). In some embodiments, the active structure 262 in the third level layout 200c overlaps the active structure 202 in the ground level layout 200a, and the active structure 264 in the third level layout 200c overlaps the active structure 224 in the ground level layout 200a.

A gate line 266 intersecting and covering the active structure 262 may be functioned as a gate terminal of the pull up transistor 112. For instance, the gate line 266 may extend along the direction X while the active structure 262 extends along the direction Y. In some embodiments, the gate line 266 in the third level layout 200c and the gate lines 204, 226 in the ground level layout 200a overlap, and may extend along the same direction (e.g., the direction X). A conductive via 268 may extend from the interconnection pattern 246 in the second level layout 200b to bottom of the gate line 266, such that the gate line 204 of the pull down transistor 114 in the ground level layout 200a can be routed to the gate line 266 of the pull up transistor 112 in the third level layout 200c through the conductive via 206 in the ground level layout 200a, the interconnection pattern 246 in the second level layout 200b and the conductive via 266 extending from the second level layout 200b to the third level layout 200c.

Similarly, a gate line 270 intersecting and covering the active structure 264 may be functioned as a gate terminal of the pull up transistor 116. That gate lines 266, 270 are laterally spaced apart from each other, and may extend along the same direction (e.g., the direction X). In some embodiments, the gate line 270 in the third level layout 200c and the gate lines 216, 238 in the ground level layout 200a overlap, and may extend along the same direction (e.g., the direction X). A conductive via 272 may extend from the interconnection pattern 258 in the second level layout 200b to bottom of the gate line 270, such that the gate line 238 of the pull down transistor 118 in the ground level layout 200a can be routed to the gate line 270 of the pull up transistor 116 in the third level layout 200c through the conductive via 240 in the ground level layout 200a, the interconnection pattern 258 in the second level layout 200b and the conductive via 272 extending from the second level layout 200b to the third level layout 200c.

Although not shown, source/drain structures of the pull up transistor 112 may be formed in portions of the active structure 262 at opposite sides of the gate line 266. A conductive via 274 may extend from the interconnection pattern 248 in the second level layout 200b to one of these source/drain structures in the active structure 262, such that the conductive via 210 coupled to the common source/drain structure of the pull down transistor 114 and the access transistor 120 can be routed to the source/drain structure of the pull up transistor 112 through the interconnection pattern 248 in the second level layout 200b and the conductive via 268 extending from the second level layout 200b to the third level layout 200c. In addition, such source/drain structure of the pull up transistor 112 is further connected to the gate line 270 of the pull up transistor 116 by a butted contact 276 laterally extending above the active structure 262 and the gate line 270. In some embodiments, the butted contact 276 is substantially aligned with the active structure 262, and intersected with the gate line 270. Further, as will be described with reference to FIG. 2D, the other source/drain structure of the pull up transistor 112 disposed at another side of the gate line 266 may be routed to the fourth level layout 200d by a conductive via.

Similarly, source/drain structures of the pull up transistor 116 may be formed in portions of the active structure 264 at opposite sides of the gate line 270. A conductive via 278 may extend from the interconnection pattern 256 in the second level layout 200b to one of these source/drain structures in the active structure 264, such that the conductive via 232 coupled to the common source/drain structure of the pull down transistor 118 and the access transistor 122 can be routed to the source/drain structure of the pull up transistor 116 through the interconnection pattern 256 in the second level layout 200b and the conductive via 278 extending from the second level layout 200b to the third level layout 200c. In addition, such source/drain structure of the pull up transistor 116 is further connected to the gate line 266 of the pull up transistor 112 by a butted contact 280 laterally extending above the active structure 264 and the gate line 266. In some embodiments, the butted contact 280 is substantially aligned with the active structure 264, and intersected with the gate line 266. Further, as will be described with reference to FIG. 2D, the other source/drain structure of the pull up transistor 116 disposed at another side of the gate line 270 may be routed to the fourth level layout 200d by a conductive via.

Moreover, a through via 282 may extend from the reference voltage line 250 in the second level layout 200b to the third level layout 200c. As will be further described with reference to FIG. 2D, the through via 282 may be further routed to another reference voltage line in the fourth level layout 200d. Similarly, a through via 284 may extend from the reference line 260 in the second level layout 200b to the third level layout 200c, and this through via 284 may be further routed to another reference line in the fourth level layout 200d. In addition, a through via 286 may extend from the word line 252 in the second level layout 200b to the third level layout 200c. As will be further described with reference to FIG. 2D, the through via 286 may be further routed to another word line in the fourth level layout 200d. Similarly, a through via 288 may extend from the word line 254 in the second level layout 200b to the third level layout 200c, and this through via 288 may be further routed to another word line in the fourth level layout 200d.

As similar to the ground level layout 200a and the second level layout 200b, conductive elements of the third level layout 200c disposed along a boundary of each cell 100 may be shared with surrounding cells 100. For instance, these conductive elements may include the through vias 282, 284, 286, 288. In those embodiments where the layouts of adjacent cells 100 at the ground level are in mirror symmetry with respect to a shared boundary, layout of adjacent cells 100 at the third level may be symmetry with respect to a shared boundary as well. In these embodiments, the through vias 284, 288 at the common boundary of the cells 100-1, 100-2 may be shared by the cells 100-1, 100-2. Furthermore, the active structures 262, 264 extending through each cell 100 may be shared with other cells 100 in the same column.

Figure 2D:
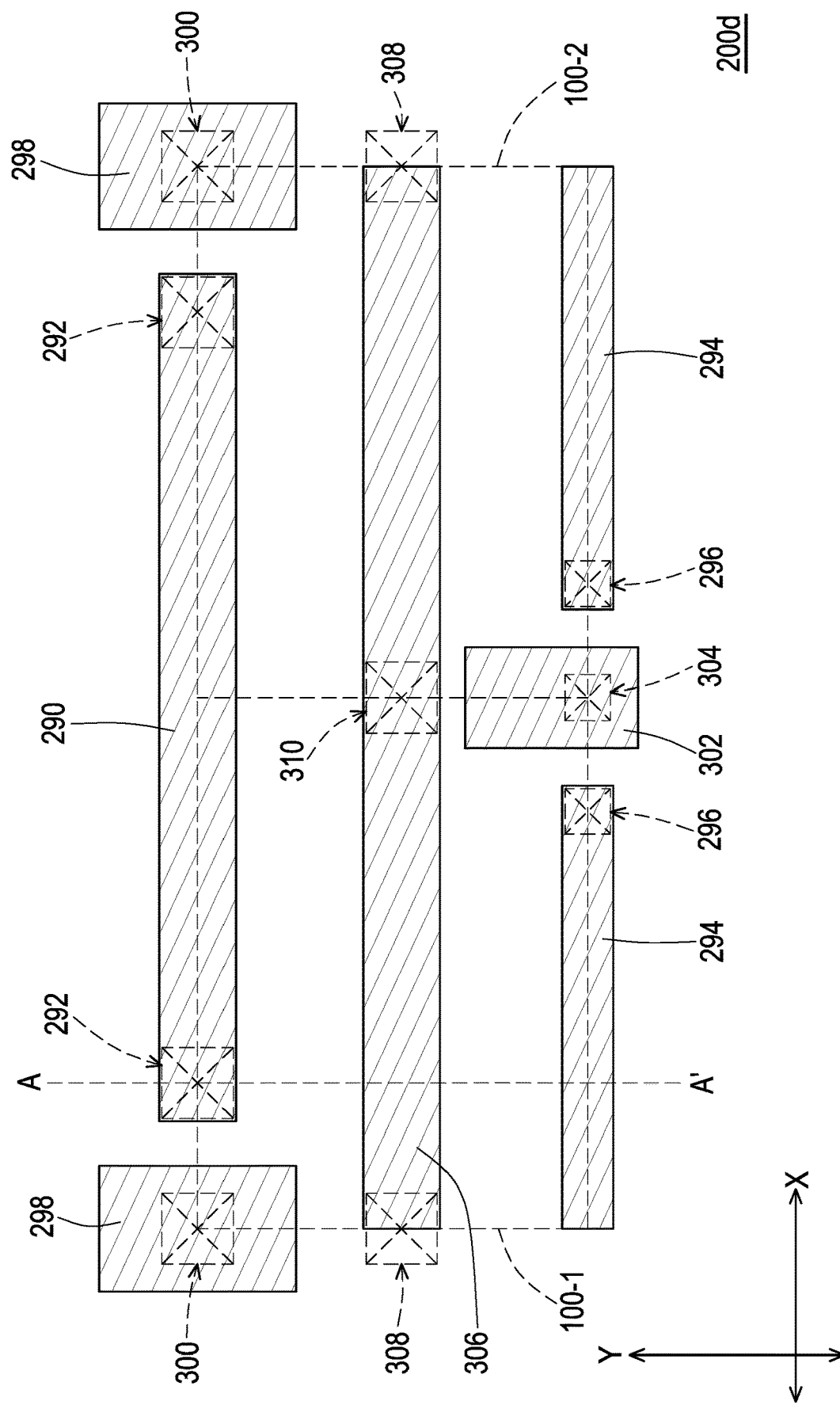
FIG. 2D is a layout diagram illustrating a fourth level layout of the adjacent cells, according to some embodiments of the present disclosure.

FIG. 2D is a layout diagram illustrating a fourth level layout 200d of the adjacent cells 100-1, 100-2, according to some embodiments of the present disclosure.

Referring to FIG. 2C and FIG. 2D, elements in the third level layout 200c may be routed to signal lines deployed in the fourth level layout 200d lying over the third level layout 200c. The term "signal line" in the present disclosure indicates a conductive line coupled to a signal source, such as a working voltage $V_{DD}$, a reference voltage $V_{SS}$, a word line voltage or the like. In addition to be deployed at the fourth level, some signal lines may be placed at other level(s). For instance, the reference voltage line 250, 260 coupled to the reference voltage $V_{SS}$, the word lines 252, 254 coupled to the word line voltage and the bit lines BL1, BL2 coupled to bit line voltages may be disposed in the second level layout 200b, as described with reference to FIG. 2B.

As shown in FIG. 2C and FIG. 2D, one of the source/drain structures of the pull up transistor 112 in the third level layout 200c (the source/drain structure not coupled to the gate line 270 of the other pull up transistor 116) may be routed to a working voltage line 290 in the fourth level layout 200d through a conductive via 292. The term "working voltage line" in the present disclosure indicates a signal line coupled to the working voltage $V_{DD}$ as described with reference to FIG. 1A. In some embodiments, the working voltage line 290 in the fourth level layout 200d intersects with the active structure 262 of the pull up transistor 112 in the third level layout 200c. For instance, the working voltage line 290 extends along the direction X while the active structure 262 extends along the direction Y. Similarly, the source/drain structure of the pull up transistor 116 not coupled to the gate line 266 of the pull up transistor 112 may be routed to a working voltage line 294 in the fourth level layout 200d through a conductive via 296. In some embodiments, the working voltage line 294 in the fourth level layout 200d intersects with the active structure 264 of the pull up transistor 116 in the third level layout 200c. For instance, the working voltage line 294 extends along the direction X while the active structure 264 extends along the direction Y.

In addition, the through via 282 extending from the second level layout 200*b* to the third level layout 200*c* may be further routed to a reference voltage line 298 in the fourth level layout 200*d* through a conductive via 300. Accordingly, the reference voltage line 250 disposed in the second level layout 200*b* and coupled to the through via 282 can be connected to the reference voltage line 298 in the fourth level layout 200*d*. Similarly, the through via 284 extending from the second level layout 200*b* to the third level layout 200*c* may be further routed to a reference voltage line 302 in the fourth level layout 200*d* through a conductive via 304. Therefore, the reference voltage line 260 disposed in the second level layout 200*b* and coupled to the through via 284 can be connected to the reference voltage line 302 in the fourth level layout 200*d*. Although not shown, the reference voltage lines 298, 302 in the fourth level layout 200*d* may be further routed to other reference voltage lines at higher layout level.

Further, the through via 286 extending from the second level layout 200*b* to the third level layout 200*c* may be further routed to a word line 306 in the fourth level layout 200*d* through a conductive via 308. Similarly, the through via 288 extending from the second level layout 200*b* to the third level layout 200*c* may be further routed to the word line 306 in the fourth level layout 200*d* through a conductive via 310. Accordingly, the word lines 252, 254 disposed in the second level layout 200*b* and coupled to the through vias 286, 288 can be connected to the word line 306 in the fourth level layout 200*d*.

In some embodiments, the signal lines in the fourth level layout 200*d* can be shared by adjacent cells 100. For instance, the working voltage lines 290, 294 and the word line 306 may respectively extend across a common boundary of adjacent cells 100 arranged along the direction X. Further, the reference voltage lines 298, 302 may respectively be disposed at an intersection of four adjacent cells 100, and shared by these cells 100. Moreover, in some embodiments, the conductive vias 292, 296, 300, 304, 308, 310 are arranged along a boundary of each cell 100, and can be shared by adjacent cells 100. As similar to the ground level layout 200*a*, second level layout 200*b* and the third level layout 200*c*, layout of adjacent cells 100 at the fourth level may be symmetry with respect to the shared boundary.

It should be noted that, although each cell 100 is described as spanning across four horizontal levels, each cell 100 may span across more or less than 4 horizontal levels, as long as the NFETs and the PFETs are disposed at different horizontal levels.

Figure 3A:
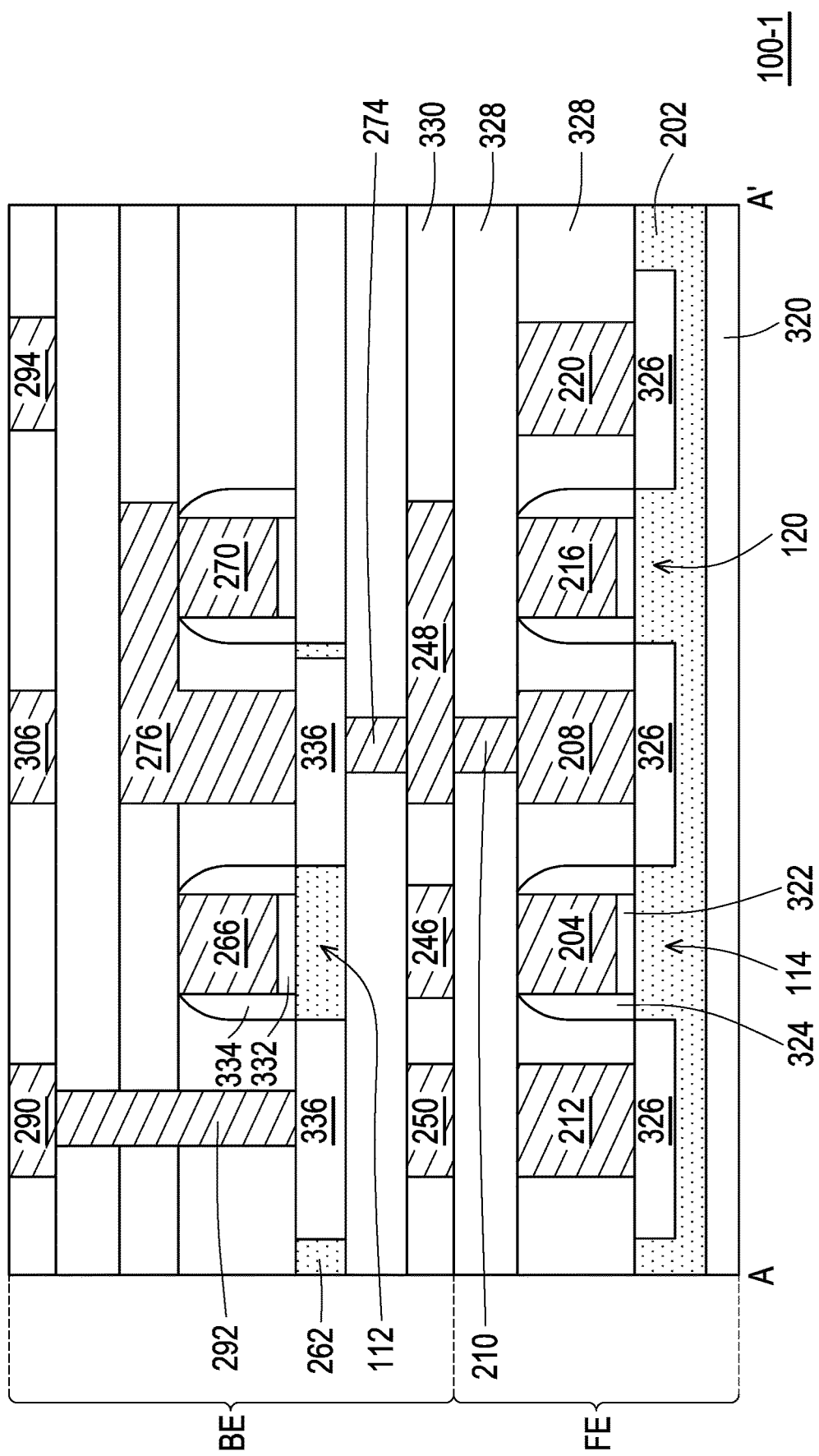
FIG. 3A is a schematic cross-sectional view along a A-A' line as shown in FIG. 2A through FIG. 2D.

FIG. 3A is a schematic cross-sectional view along a A-A' line of the cell 100-1, as shown in FIG. 2A through FIG. 2D.

Referring to FIG. 2A and FIG. 3A, NFETs at the ground level are respectively built on an active structure. For instance, the pull down transistor 114 and the access transistor 120 are formed on the active structure 202. In those embodiments where the transistors at the ground level are planar type FETs, the active structure 202 as one of the active structures at the ground level may be a doped region in a semiconductor substrate 320. In alternative embodiments where the transistors at the ground level are fin type FETs or GAA FETs, the active structure 202 as one of the active structures at the ground level may be a semiconductor fin structure or a stack of semiconductor nanosheets/rods formed at a surface of the semiconductor substrate 320. Further, as the transistors at the ground level are NFETs, the active structure 202 and other active structures at the ground level may be formed with P-type.

Each of the transistors at the ground level may include a gate structure. The gate structure may include a gate line disposed on an active structure; a gate dielectric layer lying between the gate line and the active structure; and a sidewall spacer covering sidewalls of the gate line and the gate dielectric layer. For instance, the gate structure of the pull down transistor 114 may include the gate line 204 running on the active structure 202; a gate dielectric layer 322 extending between the gate line 204 and the active structure 202; and a sidewall spacer 324 covering sidewalls of the gate line 204 and the gate dielectric layer 322. Similarly, a gate structure of the access transistor 120 may include the gate line 216, another gate dielectric layer 322 and another sidewall spacer 324.

Further, each transistor at the ground level further includes source/drain structure at opposite side of the gate structure, and the source/drain structures may be formed in an active structure, as, for example, doped regions or epitaxial structures. For instance, the pull down transistor 114 has source/drain structures 326 formed in the active structure 202 and located at opposite sides of the gate structure including the gate line 204. Similarly, two source/drain structures 326 are disposed at opposite sides of the gate line 216 of the access transistor 120. Further, one of the source/drain structures 326 may be shared by the pull down transistor 114 and the access transistor 120.

Conductive patterns including the conductive patterns 208, 212, 220 and conductive vias including the conductive via 210 are disposed on the source/drain structures 326 for out routing the NFETs. In some embodiments, these conductive patterns as well as the gate structures of the transistors at the ground level are laterally surrounded by a dielectric layer 328. In addition, these conductive vias including the conductive via 210 may be laterally surrounded by another dielectric layer 328 lying on the conductive patterns and the gate structures.

The ground level layout 200*a* as described above may be located in a front-end-of-line (FEOL) structure FE of a semiconductor chip, and the second level layout 200*b*, the third level layout 200*c* and the fourth level layout 200*d* described with reference to FIG. 2B, FIG. 2C and FIG. 2D may be embedded in a back-end-of-line (BEOL) structure BE formed over the FEOL structure FE. The BEOL structure BE may include a stack of interlayer dielectric layers 330 formed on the dielectric layers 328. For conciseness, only the bottommost interlayer dielectric layer 330 is labeled.

Referring to FIG. 2B and FIG. 3A, the conductive elements in the second level layout 200*b* may be formed in the bottommost interlayer dielectric layer 330. As shown in FIG. 3A, the interconnection patterns 246, 248 and the reference voltage line 250 may be laterally surrounded by the bottommost interlayer dielectric layer 330.

Referring to FIG. 2C and FIG. 3A, the PFETs including the pull up transistor 112 are respectively built on an active structure lying over the semiconductor substrate 320. For instance, the pull up transistor 112 is formed on the active structure 262 laterally surrounded by one of the interlayer dielectric layers 330 lying over the semiconductor substrate 320. Although not shown in FIG. 3A, the through vias 282, 284, 286, 288 described with reference to FIG. 2C may extend through the interlayer dielectric layer 330 surrounding the active structures of the PFETs.

As similar to the NFETs, the PFETs may respectively include a gate structure and a pair of source/drain structures at opposite sides of the gate structure. In some embodiments, the gate structure may include a gate line running on an active structure; a gate dielectric layer extending between the gate line and the active structure; and a sidewall spacer covering sidewalls of the gate line and the gate dielectric layer. As an example, the gate structure of the pull up transistor 112 may include the gate line 266 lying above the active structure 262; a gate dielectric layer 332 sandwiched between the gate line 266 and the active structure 262; and a sidewall spacer 334 covering sidewalls of the gate line 266 and the gate dielectric layer 332. As partially shown in FIG. 3A, the pull up transistor 116 may also have a gate structure including the gate line 270, another gate dielectric layer 332 lying below the gate line 270 and another sidewall spacer 334 covering sidewalls of the gate line 270 and the gate dielectric layer 332. In addition, in some embodiments, the source/drain structures of each PFET are formed in an active structure, as, for example, doped regions or epitaxial structures. For instance, the pull up transistor 112 may have source/drain structures 336 formed in the active structure 262 and located at opposite sides of the gate structure including the gate line 266. Although not shown, the pull up transistor 116 may also have a pair of source/drain structures 336 formed in another active structure (i.e., the active structure 264 as described with reference to FIG. 2C).

One of the source/drain structures 336 of each PFET may be connected to the second level layout 200b by a conductive via. For instance, one of the source/drain structures 336 of the pull up transistor 112 may be connected to the interconnection pattern 248 in the second level layout 200b through the conductive via 274. Further, the conductive via 274 may be coupled to the shared source/drain structure 326 of the pull down transistor 114 and the access transistor 120 through the interconnection pattern 248, the conductive via 210 and the conductive pattern 208. The conductive via 274, the interconnection pattern 248, the conductive via 210 and the conductive pattern 208 provide a vertical conduction path connecting the shared source/drain terminal of the pull down transistor 114 and the access transistor 120 to a source/drain terminal of the pull up transistor 112, and these connected source/drain terminals as well as the vertical conduction path collectively form the storage node SN1 as described with reference to FIG. 1. In other words, the storage node SN1 spans across multiple horizontal levels, and extends from the FEOL structure FE to the BEOL structure BE. Similarly, although not shown in FIG. 3A, the shared source/drain terminal of the pull down transistor 118 and the access transistor 122 may be connected to a source/drain terminal of the pull up transistor 116 through a vertical conduction path, and the storage node SN2 as described with reference to FIG. 1 spans across multiple horizontal levels and extends from the FEOL structure FE to the BEOL structure BE.

Furthermore, the source/drain structure 336 of each PFET routed to the second level layout 200b may be further connected to a gate line of another PFET by a butted contact. For instance, one of the source/drain structures 336 of the pull up transistor 112 is routed to the interconnection pattern 248 in the second level layout 200b, and is also connected to the gate line 270 of the pull up transistor 116 through the butted contact 276. In some embodiments, the butted contacts including the butted contact 276 respectively has a vertically extending portion standing on the corresponding source/drain structure 336 and a laterally extending portion bridging the vertically extending portion to the corresponding gate line. For instance, the butted contact 276 has a vertically extending portion standing on the source/drain structure 336 between the gate lines 266, 270, and has a laterally extending portion connecting the vertically extending portion to a top surface of the gate line 270.

Referring to FIG. 2D and FIG. 3A, the signal lines in the fourth level layout 200b may be formed over the third level layout 200c. As shown in FIG. 3A, the working voltage lines 290, 294 and the word line 306 are formed in one of the interlayer dielectric layers 330 lying over the butted contact 276 in the second level layout 200c. Some of these signal lines are connected to the PFETs in the third level layout 200c. For instance, the working voltage line 290 is connected to one of the source/drain structures 336 of the pull up transistor 112 through the conductive via 292, such that the conductive via 292 and the butted contact 276 are located at opposite sides of the gate structure including the gate line 266.

As described above, each cell 100 spans across multiple horizontal levels. Particularly, the PFETs lie over the NFETs, and some of the PFETs and some of the NFETs may overlap. For instance, as shown in FIG. 3A, the pull up transistor 112 and the pull down transistor 114 may overlap. In some embodiments, the active structure 262, the gate structure and the source/drain structures 336 of the pull up transistor 112 overlap the active structure 202, the gate structure and the source/drain structures 326 of the pull down transistors 114, respectively. Similarly, although not shown, the pull up transistor 116 and the pull down transistor 118 may overlap as well.

Figure 3B:
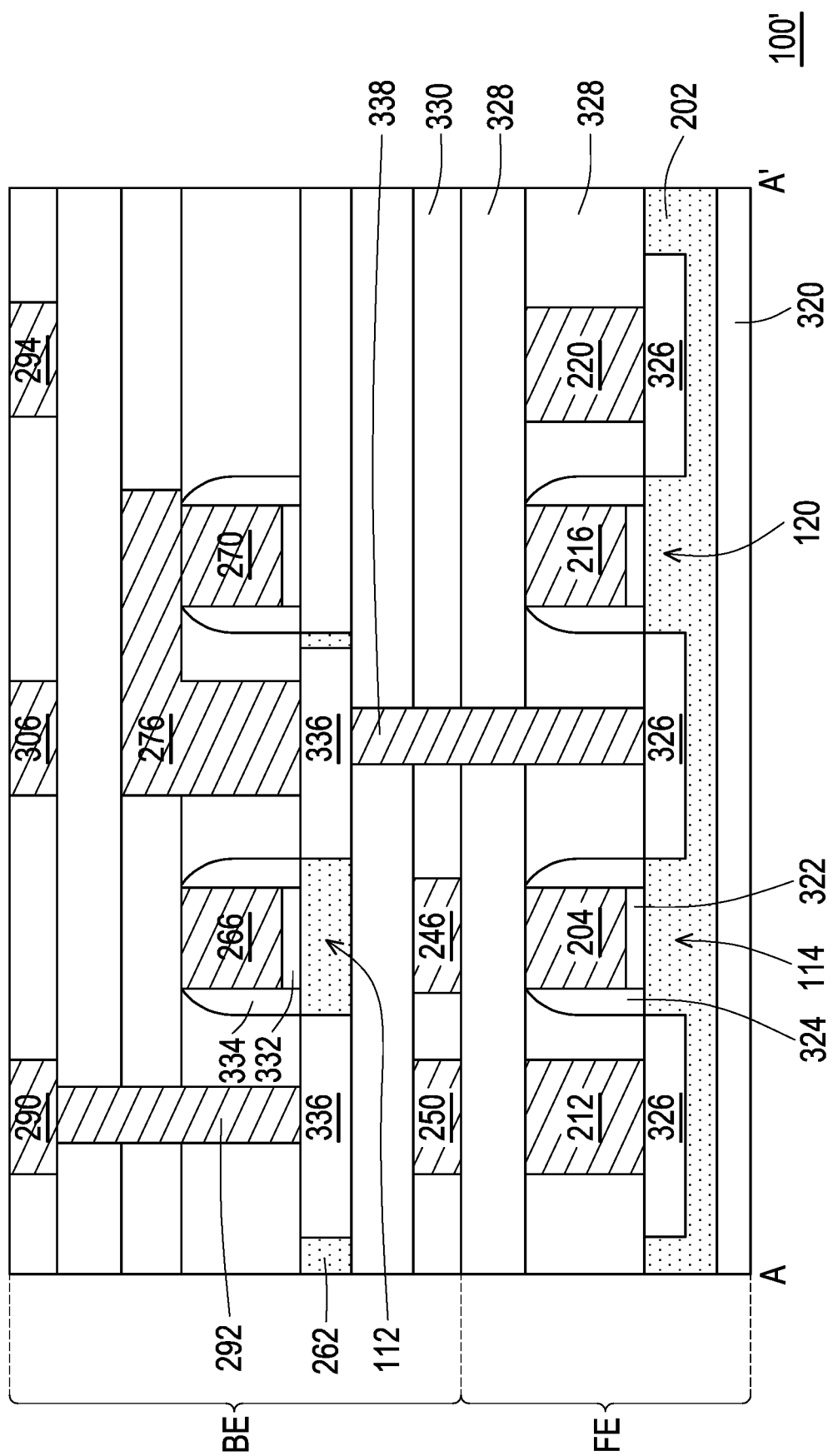
FIG. 3B is a schematic cross-sectional view of a cell, according to alternative embodiments of the present disclosure.

FIG. 3B is a schematic cross-sectional of a cell 100', according to alternative embodiments of the present disclosure. The cell 100' is similar to the cell 100 described with reference to FIG. 2A through FIG. 2D and FIG. 3A. Therefore, only differences between the cells 100, 100' will be described. The same or the like parts of the cells 100, 100' would not be repeated again.

Referring to FIG. 2A through FIG. 2D and FIG. 3A, one of the source/drain structures 336 of the pull up transistor 112 is routed to the shared source/drain structure 326 of the pull down transistor 114 and the access transistor 120 through the conductive via 274, the interconnection pattern 238, the conductive via 210 and the conductive pattern 208. On the other hand, as shown in FIG. 3B, such source/drain structure 336 of the pull up transistor 112 is routed to the shared source/drain structure 326 of the pull down transistor 114 and the access transistor 120 by a through via 338. The through via 338 may penetrate through the dielectric layers 328 and some of the interlayer dielectric layers 330, to establish electrical contact between the source/drain structures 326, 336. Similarly, although not shown, one of the source/drain structures 336 of the pull up transistor 116 may be routed to the shared source/drain structure 326 of the pull down transistor 118 and the access transistor 122 by another through via similar to the through via 338.

As similar to the variation of the routing scheme described with FIG. 3B, the through via 282, the reference voltage line 250 and the conductive via 214 shown in FIG. 2A through FIG. 2C may be replaced by a through via extending from the conductive pattern 212 (shown in FIG. 2A to bottom of the conductive via 300 (shown in FIG. 2D).

FIG. 4A through FIG. 4E are cross-sectional views illustrating structures at stages during manufacturing of a PFET, according to some embodiments of the present disclosure.

Figure 4A:
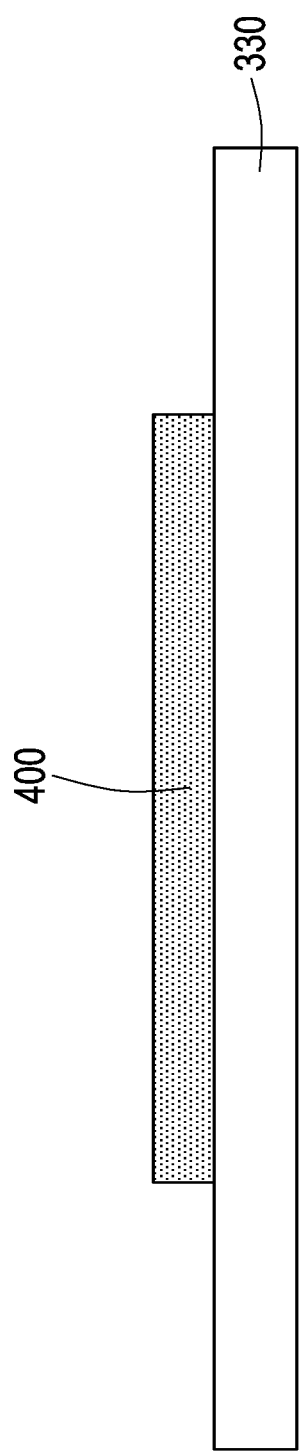
FIG. 4A through FIG. 4E are cross-sectional views illustrating structures at stages during manufacturing of a PFET, according to some embodiments of the present disclosure.

Referring to FIG. 4A, a semiconductor pattern 400 may be formed on an interlayer dielectric layer 330. In some embodiments, a method for forming the semiconductor pattern 400 includes globally depositing a semiconductor layer, and patterning the semiconductor layer to form the semiconductor pattern 400 by a lithography process and an etching process. The semiconductor pattern 400 is formed of a semiconductor material. For instance, the semiconductor material is amorphous silicon.

Figure 4B:
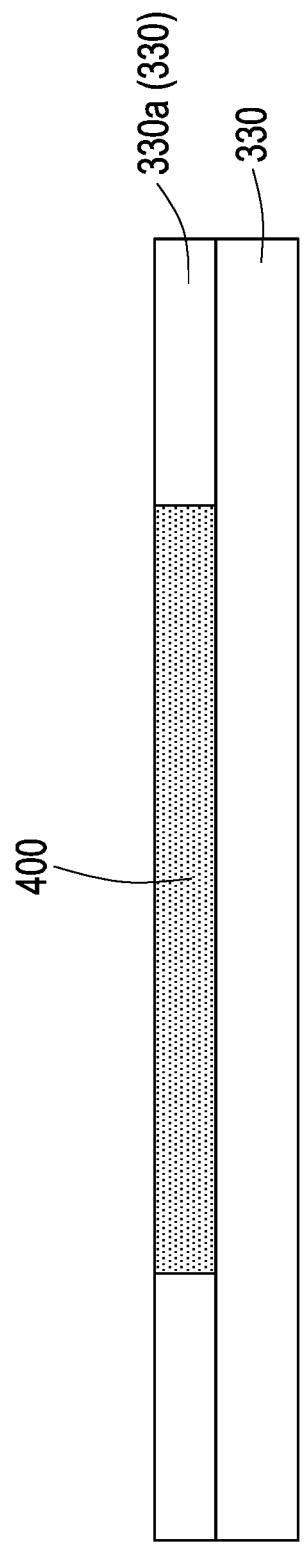

Referring to FIG. 4B, another interlayer dielectric layer 330 (referred as an interlayer dielectric layer 330a) may be formed to laterally surround the semiconductor pattern 400. In some embodiments, a method for forming the interlayer dielectric layer 330a includes forming a dielectric layer globally covering the semiconductor pattern 400 and the underlying interlayer dielectric layer 330, and performing a planarization process to remove portions of the dielectric layer above the semiconductor pattern 400. Remained portions of the dielectric layer form the interlayer dielectric layer 330a. As examples, the planarization process may include a polishing process, an etching process or a combination thereof.

Figure 4C:
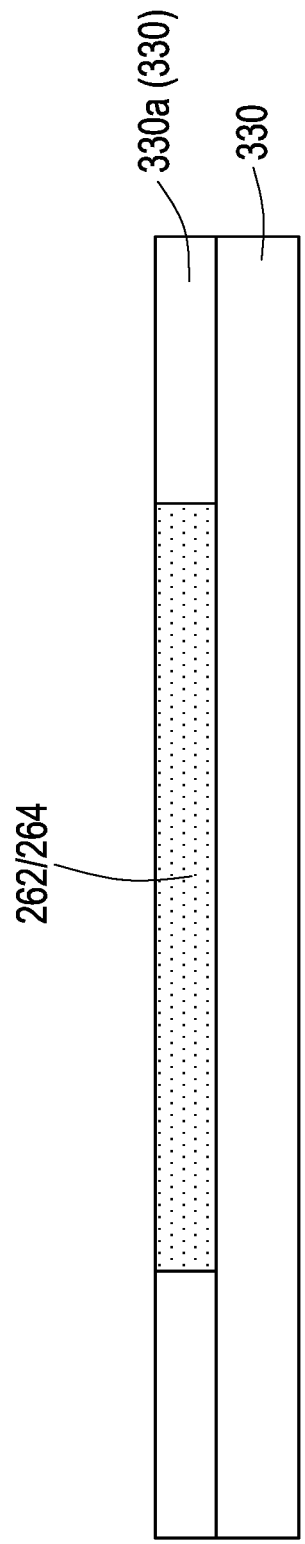

Referring to FIG. 4C, an annealing process is performed on the semiconductor pattern 400, such that the semiconductor pattern 400 turns into the active structure 262/264 for a PFET (i.e., the pull up transistor 112 or the pull up transistor 116). In those embodiments where the semiconductor pattern 400 is formed of amorphous silicon, the amorphous silicon may be crystallized to form polycrystalline silicon during the annealing process. Accordingly, in these embodiments, the formed active structure 262/264 includes polycrystalline silicon. In some embodiments, the annealing process is a laser annealing process, and a process temperature of the laser annealing process may be about 400° C. As a result of such annealing process, a field effect mobility and/or other characteristics of the PFET can be significantly improved.

Figure 4D:
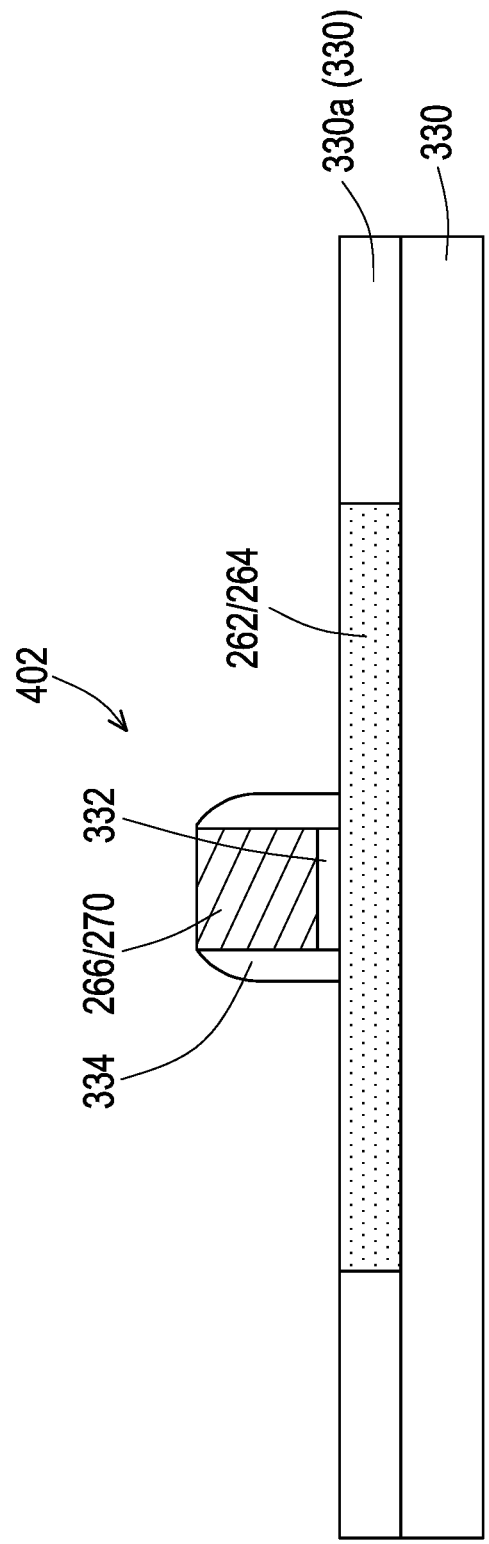

Referring to FIG. 4D, a gate structure 402 is formed on the active structure 262/264. As described with reference to FIG. 3A, the gate structure 402 of each PFET includes a gate line 266/270 disposed over the active structure 262/264; a gate dielectric layer 332 lying between the gate line 266/270 and the active structure 262/264; and a sidewall spacer 334 covering sidewalls of the gate line 266/270 and the gate dielectric layer 332. In some embodiments, the gate line 266/270 is formed of polycrystalline silicon. In these embodiments, a method for forming the gate structure 402 may include sequentially forming a dielectric layer and a conductive layer on the active structure 262/264, and patterning the dielectric layer and the conductive layer to form the gate dielectric layer 332 and the gate line 266/270, respectively. Subsequently, the sidewall spacer 334 may be formed on sidewalls of the gate line 266/270 and the gate dielectric layer 332 by a deposition process and an etching back process. In alternative embodiments where the gate line 266/270 is formed of a metallic material, a replacement gate process may be used for forming the gate structure 402. Further, although not shown, a pair of lightly doped regions may be optionally formed in the active structure 262/264 at opposite sides of the gate line 266/270 before formation of the sidewall spacer 334.

Figure 4E:
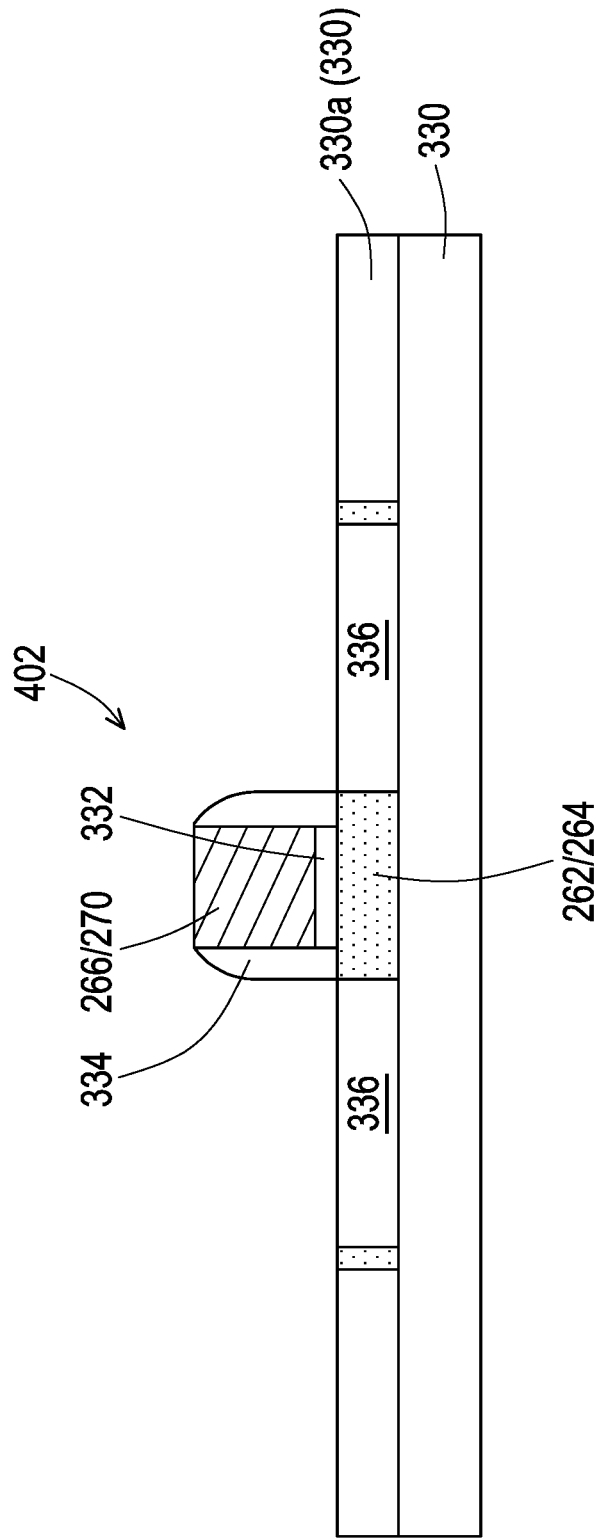

Referring to FIG. 4E, the source/drain structures 336 are formed in the active structure 262/264 at opposite sides of the gate structure 402. In those embodiments where the source/drain structures 336 are doped regions in the active structure 262/264, a method for forming the source/drain structures 336 may include an ion implantation process and an annealing process. In alternative embodiments, a method for forming the source/drain structures 336 includes forming openings in the active structure 262/264, and filling the source/drain structures 336 into these openings by, for example, an epitaxial process.

Up to here, a PFET has been formed. Afterwards, further back-end-of-line (BEOL) processes may be performed for out routing the PFET. As compared to the NFET, the PFET is embedded in the BEOL structure BE including a stack of the interlayer dielectric layers 330 formed over the semiconductor substrate 320, and uses the active structure 262/264 formed from a deposited semiconductor layer.

As above, a memory device (e.g., a SRAM device) is provided. Particularly, NFETs in each cell of the memory device are formed at a surface of a semiconductor substrate, while PFETs in each cell of the memory device are disposed at an elevated horizontal level over the surface of the semiconductor substrate. By deploying each cell of the memory device at different horizontal levels, the memory device is no longer limited to two-dimensional design. Further, when the PFETs and the NFETs overlap, a footprint area of the memory device can be significantly reduced without further cutting down spacings between adjacent elements in the memory device.

In an aspect of the present disclosure, a memory device is provided. The memory device comprises: a plurality of memory cells, each comprising a latch circuit formed of N-type field effect transistors (NFETs) and P-type field effect transistors (PFETs), wherein the NFETs are formed at a surface of a semiconductor substrate, and the PFETs are disposed at an elevated level over the NFETs.

In another aspect of the present disclosure, a memory device is provided. The memory device comprises a latch circuit, comprising: a first active structure and a second active structure, disposed at a ground level and having a first conductive type; a first gate line and a second gate line, disposed at the ground level, wherein the first gate line covers and intersects with the first active structure, and the second gate line covers and intersects with the second active structure; a third active structure and a fourth active structure, disposed at an elevated level over the ground level, and having a second conductive type complementary to the first conductive type; and a third gate line and a fourth gate line, disposed at the elevated level, wherein the third gate line covers and intersects with the third active structure, and the fourth gate line covers and intersects with the fourth active structure.

In yet another aspect of the present disclosure, a memory device is provided. The memory device comprises: a first inverter and a second inverter, cross-coupled with each other, wherein the first inverter comprises a first NFET and a first PFET coupled with the first NFET by a common source/drain terminal, the second inverter comprises a second NFET and a second PFET coupled with the second NFET by a common source/drain terminal, the first and second NFETs are disposed in a front-end-of-line (FEOL) structure of a semiconductor chip, and the first and second PFETs are embedded in a back-end-of-line (BEOL) structure formed over the FEOL structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a plurality of memory cells, each comprising a latch circuit formed of N-type field effect transistors (NFETs) and P-type field effect transistors (PFETs), wherein the NFETs are formed at a surface of a semiconductor substrate, and the PFETs are disposed at an elevated level over the NFETs,
wherein the NFETs are built on first and second active structures laterally spaced apart from each other, the PFETs are built on third and fourth active structures laterally spaced apart from each other and having a conductive type complementary to a conductive type of the first and second active structures.

2. The memory device according to claim 1, wherein the NFETs are overlapped with the PFETs.

3. The memory device according to claim 1, wherein the NFETs comprise a first pull down transistor and a second pull down transistor, the PFETs comprise a first pull up transistor and a second pull up transistor, a source/drain terminal of the first pull down transistor is coupled to a source/drain terminal of the first pull up transistor via a vertical conduction path extending from the semiconductor substrate to the elevated level, and a source/drain terminal of the second pull down transistor is coupled to a source/drain terminal of the second pull up transistor via another vertical conduction path extending from the semiconductor substrate to the elevated level.

4. The memory device according to claim 1, wherein each memory cell further comprises a first access transistor and a second access transistor coupled to first and second storage nodes of the latch circuit, and the first and second access transistors are formed at the surface of the semiconductor substrate and located below the PFETs of the latch circuit.

5. The memory device according to claim 4, wherein the first access transistor is also coupled to a first bit line, the second access transistor is also coupled to a second bit line, and the first and second bit lines extend between the NFETs and the PFETs.

6. The memory device according to claim 4, wherein the first and second access transistors are coupled to a word line extending above and overlapping the PFETs.

7. A memory device, comprising:
a latch circuit, comprising:
a first active structure and a second active structure, disposed at a ground level and having a first conductive type;
a first gate line and a second gate line, disposed at the ground level, wherein the first gate line covers and intersects with the first active structure, and the second gate line covers and intersects with the second active structure;
a third active structure and a fourth active structure, laterally spaced apart from and parallel with each other at an elevated level over the ground level, and having a second conductive type complementary to the first conductive type; and
a third gate line and a fourth gate line, disposed at the elevated level, wherein the third gate line covers and intersects with the third active structure, and the fourth gate line covers and intersects with the fourth active structure.

8. The memory device according to claim 7, wherein the third active structure overlaps the first active structure, and the fourth active structure overlaps the second active structure.

9. The memory device according to claim 7, wherein the third gate line overlaps the first gate line, and the fourth gate line overlaps the second gate line.

10. The memory device according to claim 7, wherein the first and second active structures are formed at a surface of a semiconductor substrate, and the third and fourth active structures as well as the third and fourth gate lines are embedded in a stack of interlayer dielectric layers formed over the semiconductor substrate.

11. The memory device according to claim 7, wherein the third and fourth active structures include polycrystalline silicon.

12. The memory device according to claim 7, wherein each memory cell further comprises:
first source/drain structures, formed in the first active structure and located at opposite sides of the first gate line;
second source/drain structures, formed in the second active structure and located at opposite sides of the second gate line;
third source/drain structures, formed in the third active structure and located at opposite sides of the third gate line; and
fourth source/drain structures, formed in the fourth active structure and located at opposite sides of the fourth gate line.

13. The memory device according to claim 12, wherein one of the first source/drain structures is coupled with one of the third source/drain structures via a vertical conduction path extending from the ground level to the elevated level, and one of the second source/drain structures is coupled with one of the fourth source/drain structures via another vertical conduction path extending from the ground level to the elevated level.

14. The memory device according to claim 13, wherein the one of the third source/drain structures is coupled to the fourth gate line via a first butted contact, and the one of the fourth source/drain structures is coupled to the third gate line via a second butted contact.

15. The memory device according to claim 14, wherein
the first butted contact has a vertically extending portion standing on the one of the source/drain structures, and has a laterally extending portion bridging the vertically extending portion to the fourth gate line, and
the second butted contact has a vertically extending portion standing on the one of the source/drain structures, and has a laterally extending portion bridging the vertically extending portion to the third gate line.

16. The memory device according to claim 7, wherein each memory cell further comprises:
a fifth gate line and a sixth gate line, disposed at the ground level, wherein the fifth gate line covers and intersects with the first active structure, the sixth gate line covers and intersects with the second active structure, the fifth gate line is laterally spaced apart from the first gate line, and the sixth gate line is laterally spaced apart from the second gate line.

17. The memory device according to claim 16, wherein the fifth gate line is overlapped with the fourth gate line, and the sixth gate line is overlapped with the third gate line.

18. A memory device, comprising:
a first inverter and a second inverter, cross-coupled with each other, wherein the first inverter comprises a first NFET and a first PFET coupled with the first NFET by a common source/drain terminal, the second inverter comprises a second NFET and a second PFET coupled with the second NFET by a common source/drain terminal, the first and second NFETs are disposed in a front-end-of-line (FEOL) structure of a semiconductor chip, and the first and second PFETs are embedded in a back-end-of-line (BEOL) structure formed over the FEOL structure, wherein the first and second NFETs are built on first and second active structures laterally spaced apart from each other, the first and second PFETs are built on third and fourth active devices laterally spaced apart from each other and having a conductive type complementary to a conductive type of the first and second active structures.

19. The memory device according to claim 18, wherein the common source/drain terminal of the first NFET and the first PFET spans from the FEOL structure to the BEOL structure, and the common source/drain terminal of the second NFET and the second PFET spans from the FEOL structure to the BEOL structure as well.

20. The memory device according to claim 18, wherein the first PFET overlaps the first NFET, and the second PFET overlaps the second NFET.

* * * * *